United States Patent [19]

Winter et al.

[11] Patent Number: 4,620,889

[45] Date of Patent: Nov. 4, 1986

[54] METHOD AND APPARATUS FOR PLACING A HOOK-UP WIRE ON A MOUNTING BOARD

[75] Inventors: Rudolf Winter; Albert Horner; Adalbert Lindner, all of Munich, Fed. Rep. of Germany

[73] Assignee: Siemens Aktiengesellschaft, Berlin and Munich, Fed. Rep. of Germany

[21] Appl. No.: 708,684

[22] Filed: Mar. 6, 1985

[30] Foreign Application Priority Data

Mar. 7, 1984 [DE] Fed. Rep. of Germany ....... 3408338

[51] Int. Cl.$^4$ .............................................. B32B 31/12
[52] U.S. Cl. ..................................... 156/166; 29/745; 29/829; 156/320; 156/324.4; 156/433; 156/543; 156/579; 219/56.22; 219/229; 219/237; 219/238; 228/51; 228/55; 269/903
[58] Field of Search ..................... 156/166, 320, 324.4, 156/433, 543, 176, 579, 436; 29/829, 745; 219/229, 238, 237, 56.22; 228/51, 55; 269/903

[56] References Cited

U.S. PATENT DOCUMENTS 3,627,192 12/1971 Killingsworth ..................... 219/229
3,639,193 2/1972 Hawkins .............................. 156/433

*Primary Examiner*—John J. Gallagher
*Attorney, Agent, or Firm*—Hill, Van Santen, Steadman & Simpson

[57] ABSTRACT

Previously, hook-up wires were glued to a mounting board by means of spot gluing. As disclosed herein, the insulated hook-up wire is first continuously coated with a coating of hot-melt adhesive and is then placed on the mounting board and simultaneously bonded by means of a heated laying tip of an application tool, similar to a soldering bit. When passing through the laying tip, the hook-up wire is briefly heated, whereby the coating of hot-melt adhesive is melted. The insulating layer of the hook-up wire has a higher temperature stability and is thereby not altered. In the immediately following application of the hook-up wire to the mounting board, the hot-melt adhesive cools and connects the hook-up wire to the mounting board.

6 Claims, 1 Drawing Figure

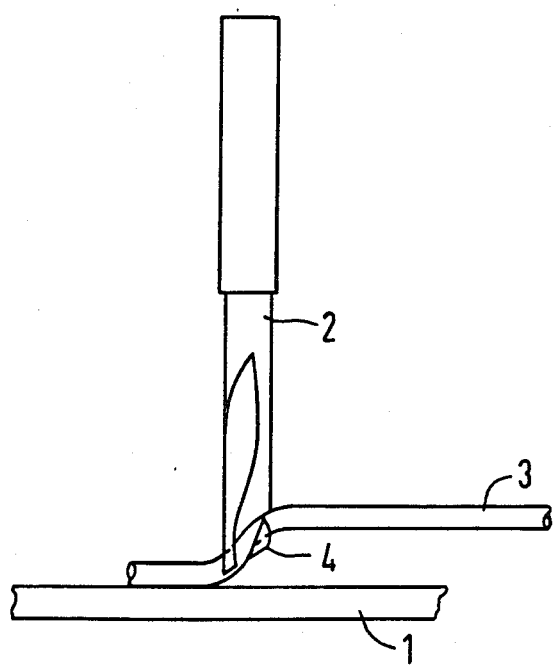

METHOD AND APPARATUS FOR PLACING A HOOK-UP WIRE ON A MOUNTING BOARD

BACKGROUND OF THE INVENTION

The invention relates to a method and an apparatus for implementation of a method for placing an electric hook-up wire on a carrier plate or mounting board.

Described circuits are known wherein the hook-up wires are held in punctiform manner on the mounting board by loops that are drawn through, for example.

It is also known to fix a hook-up wire in punctiform fashion by applying hot melt adhesive.

A gluing is also achieved in that, given a two-part gluing, activator as a first part is applied to the mounting board over a large area. Subsequently, the glue as a second part is applied at the same time as the wire.

SUMMARY OF THE INVENTION

An object of the invention is to glue the hook-up wire in continuously fixed manner to the carrier plate with low expense in terms of apparatus and production. This object is achieved by applying hot-melt adhesive to a hook-up wire and holding the adhesive at a gluable temperature at a current point of application of the hook-up wire during laying by providing the laying tool as an application tool. It is advantageous to employ a hot-melt adhesive whose bonding temperature lies below the softening temperature of the insulation of the hook-up wire. The softening temperature of the hot-melt adhesive, however, must be higher than the highest temperature to which the attached hook-up wire is exposed.

What is achieved by the invention is that only a very slight amount of adhesive is used. The area expanse of the glue on the mounting board is very small. The wire can be placed cleanly and very precisely, and can be continuously glued on in arbitrary figures, for example, orthogonally upon adherence to defined placement tracks. As a result of the slight spread of glue and the precise placement, points to be tested can be kept free without any difficulties.

A laying tool can be provided with an extremely narrow tip so as to facilitate the placement. The attachment of the wire can begin immediately next to the first terminal point and can be continuously conducted up to a region immediately before the second terminal point.

It is possible to coat the wire with hot-melt adhesive in the heated laying tool. The wire then passes through a viscous supply of hot-melt adhesive and is coated to a thickness limited by a stripper nozzle. The tool can be designed such that the hot-melt adhesive is held to the bonding temperature at the current place of application.

The laying tool is greatly simplified by applying the hot-melt adhesive to the hook-up wire in a separate apparatus and then heating it to its bonding temperature in the application tool. The application tool may have a curled portion at its underside facing the mounting board for heating. Since the moistening of the wire with hot-melt adhesive can occur significantly faster than the laying, the coated hook-up wire can be prepared for a plurality of placement locations by means of a high-performance apparatus. The hook-up wire passes through only a short heating section in the laying tool, thus substantially simplifying the structure and the manipulation of the laying tool. The hook-up wire is reliably heated by the heating strap which surrounds the hook-up wire at its underside. The pressing against the carrier plate occurs with minimum time delay in the immediately following laying region.

An apparatus for applying the hook-up wire has a wire guidance channel and can be produced from a soldering bit in a simple fashion. Since the hook-up wire is drawn into the tip of the application tool obliquely proceeding from the guidance surface, it is subjected to only slight deflection. This facilitates the draw-through. The heating section is correspondingly short, so that the inside of the hook-up wire is hardly heated and the coating of hot-melt adhesive cools rapidly after leaving the tool.

By providing the tool with a laterally open guidance channel, the wire can be introduced into the tool in a transverse direction, for example after it has been fixed to the first terminal location.

BRIEF DESCRIPTION OF THE DRAWINGS

The drawing FIGURE illustrates an apparatus according to the invention for continuous fixing of a hook-up wire to a mounting board.

DESCRIPTION OF THE PREFERRED EMBODIMENTS

The drawing FIGURE shows a side view of a mounting board 1 with a laying tip 2 perpendicular thereto which can be placed in a soldering bit and heated by the latter. The drawing also shows an insulated hook-up wire 3 whose surface is coated with a coating of hot-melt adhesive. The hook-up wire 3 passes through the laying tip 2 essentially at right angles to its longitudinal direction. At its free end, the laying tip 2 is provided with recesses similar to a bayonet-type closure which form a wire guidance channel which runs obliquely from the outside surface of the laying tip as a wire abutment surface 2 down across the end face of the tip facing the mounting board 1. That part of the laying tip lying below the wire guidance channel thus forms a heating stirrup or folded around lip 4 which heats the hook-up wire at that side facing the carrier plate 1. The temperature of the laying tip 2 is kept so high that the layer of hot-melt adhesive is briefly melted when the hook-up wire 3 is laid and drawn through. Immediately following application to the mounting board 1, the cooled hot-melt adhesive connects the hook-up wire 3 to the mounting board 1. A continuous glued connection with a narrow spread of glue is formed in this way. As a result of the fashioning of the laying channel is laterally open, so that the hook-up wire 3 can be simply and easily transversely introduced into the laying tip 2. Glued attachment of hook-up wires 3 particularly comes into consideration when modifying the mounting board 1 designed as a printed circuit board. So that the printed interconnect is not damaged, the laying tip is designed such that it is supported only at the applied hook-up wire 3 and does not touch the mounting board 1.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for fixing an insulated electric hook-up wire to a circuit board, comprising the steps of:

providing the hook-up wire with a hot-melt adhesive on its outer insulation;

providing a heated laying tool with a heated tip which has a guidance channel for heating the wire and for pressing the wire onto the board;

after applying the hot-melt adhesive on the outer insulation, placing the hook-up wire in the guidance channel; and pressing the wire onto the board and continuously moving the laying tool along the wire as the wire with the hot-melt adhesive heated up at the tip is fed through the guidance channel.

2. A method according to claim 1 including the step of pressing the wire against the mounting board by an abutment surface of the guidance channel at a wire exit and which presses against the top surface of the wire.

3. A method for fixing an electric hook-up wire to a mounting surface, comprising the steps of:

providing a length of hook-up wire to be laid with a hot-melt adhesive on its outer insulation;

providing a heated laying tool having a heated tip and an abutment surface at a wire exit, a curled portion at a wire entrance, and a laterally open wire guidance channel running from the abutment surface to the curled portion such that the wire passes beneath the abutment surface and above the curled portion;

inserting the hook-up wire into the laterally open guidance channel; and pressing the wire with the abutment surface against the mounting board and simultaneously heating the previously applied hot-melt adhesive so as to melt the adhesive at the point of pressing, and thereafter moving the heated tip along the mounting surface to lay the wire.

4. A method for at least sectional fixing of an electric hook-up wire to a mounting board, comprising the steps of:

providing a laying tool and a hot-melt adhesive;

applying the hot-melt adhesive to the hook-up wire at least over an entire length to be laid in a separate apparatus apart from the laying tool and prior to laying of the hook-up wire;

heating the adhesive on the wire to a gluable temperature at a current point of application of the hook-up wire during laying by heating the laying tool; and thereafter laying the hook-up wire with the laying tool.

5. A method according to claim 4 including the step of heating the hook-up wire by a heating curled portion of the laying tool at least at an underside of the laying tool facing the mounting board and pressing the wire against the mounting board with the laying tool immediately thereafter.

6. A method according to claim 5 including the step of providing an abutment portion spaced from the heating curled portion and which presses against a top portion of the wire to press the wire against the mounting board during the step in which the hook-up wire is laid, providing a laterally open wire guidance channel formed between the heating curled portion and the abutment portion, and prior to laying the hook-up wire, inserting the wire laterally into the wire guidance channel.

* * * * *